United States Patent
Shibuya et al.

(10) Patent No.: US 11,088,055 B2
(45) Date of Patent: Aug. 10, 2021

(54) PACKAGE WITH DIES MOUNTED ON OPPOSING SURFACES OF A LEADFRAME

(71) Applicant: TEXAS INSTRUMENTS INCORPORATED, Dallas, TX (US)

(72) Inventors: Makoto Shibuya, Beppu (JP); Noboru Nakanishi, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 20 days.

(21) Appl. No.: 16/221,291

(22) Filed: Dec. 14, 2018

(65) Prior Publication Data
US 2020/0194357 A1   Jun. 18, 2020

(51) Int. Cl.
H01L 21/00 (2006.01)
H01L 23/495 (2006.01)
H01L 23/31 (2006.01)
H01L 23/00 (2006.01)
H01L 21/48 (2006.01)

(52) U.S. Cl.
CPC .... H01L 23/49575 (2013.01); H01L 21/4825 (2013.01); H01L 23/3157 (2013.01); H01L 23/49562 (2013.01); H01L 24/09 (2013.01); H01L 24/17 (2013.01); H01L 24/49 (2013.01); H01L 24/73 (2013.01); H01L 24/85 (2013.01); H01L 2924/13091 (2013.01); H01L 2924/1426 (2013.01)

(58) Field of Classification Search
CPC ........... H01L 23/49575; H01L 23/3157; H01L 24/49
See application file for complete search history.

(56) References Cited

U.S. PATENT DOCUMENTS

| 3,915,729 | A |   | 10/1975 | Eustice |
| 5,689,135 | A | * | 11/1997 | Ball ................... H01L 23/4951 257/676 |
| 5,719,436 | A | * | 2/1998 | Kuhn ................. H01L 23/3107 257/676 |
| 5,814,881 | A | * | 9/1998 | Alagaratnam ...... H01L 23/4951 257/676 |
| 5,918,112 | A | * | 6/1999 | Shah .................. H01L 23/3107 438/107 |
| 5,926,695 | A |   | 7/1999 | Chu et al. |
| 5,994,768 | A |   | 11/1999 | Fogelson |
| 6,037,661 | A | * | 3/2000 | Palagonia ............... H01L 23/24 257/700 |
| 6,061,251 | A |   | 5/2000 | Hutchison et al. |
| 6,064,115 | A |   | 5/2000 | Moscicki |
| 6,066,515 | A |   | 5/2000 | Schoenfeld |
| 6,072,228 | A |   | 6/2000 | Hinkle et al. |

(Continued)

*Primary Examiner* — Laura M Menz
(74) *Attorney, Agent, or Firm* — Dawn Jos; Charles A. Brill; Frank D. Cimino

(57) ABSTRACT

A package includes a leadframe having first surface and a second surface opposing the first surface, the leadframe forming a plurality of leads, a first semiconductor die mounted on the first surface of the leadframe and electrically connected to at least one of the plurality of leads, a second semiconductor die mounted on the second surface of the leadframe, wire bonds electrically connecting the second semiconductor die to the leadframe, and mold compound at least partially covering the first semiconductor die, the second semiconductor die and the wire bonds.

16 Claims, 6 Drawing Sheets

(56) References Cited

U.S. PATENT DOCUMENTS

| | | | |
|---|---|---|---|
| 6,118,184 A * | 9/2000 | Ishio | H01L 23/49575 257/787 |
| 6,215,176 B1 | 4/2001 | Huang | |
| 6,372,579 B1 | 4/2002 | Tung | |
| 6,429,047 B1 * | 8/2002 | Huang | H01L 21/6835 257/E23.052 |
| 6,448,107 B1 | 9/2002 | Hong et al. | |
| 6,483,180 B1 | 11/2002 | Bayan et al. | |
| 6,515,353 B2 | 2/2003 | Stave | |
| 6,603,197 B1 * | 8/2003 | Yoshida | H01L 23/49537 257/666 |
| 6,812,556 B2 * | 11/2004 | Uchida | H01L 23/49531 257/666 |
| 7,045,888 B2 * | 5/2006 | Tsai | H01L 23/4951 257/686 |
| 7,075,177 B2 * | 7/2006 | Oka | H01L 23/3128 257/666 |
| 7,211,467 B2 | 5/2007 | Park et al. | |
| 7,772,685 B2 | 8/2010 | Huang et al. | |
| 7,842,541 B1 | 11/2010 | Rusli et al. | |
| 7,868,471 B2 * | 1/2011 | Camacho | H01L 23/49575 257/790 |
| 8,026,589 B1 | 9/2011 | Kim et al. | |
| 8,203,199 B2 | 6/2012 | Lee et al. | |
| 8,222,716 B2 | 7/2012 | Bayan | |
| 8,450,149 B2 | 5/2013 | Bayan et al. | |
| 8,546,925 B2 | 10/2013 | Herbsommer et al. | |
| 8,941,219 B2 * | 1/2015 | Camacho | H01L 23/49551 257/676 |
| 9,184,121 B2 * | 11/2015 | Lopez | H01L 24/85 |
| 9,412,717 B2 | 8/2016 | Chen et al. | |
| 9,496,208 B1 | 11/2016 | Ostrowicki | |
| 9,589,929 B2 | 3/2017 | Terrill et al. | |
| 9,711,436 B2 | 7/2017 | Gehrke | |
| 9,870,984 B2 | 1/2018 | Ranmuthu | |
| 9,966,330 B2 | 5/2018 | Terrill et al. | |
| 10,128,219 B2 * | 11/2018 | Denison | H01L 23/49548 |
| 10,340,397 B2 * | 7/2019 | Tsukagoshi | H01L 23/3157 |
| 2007/0001274 A1 | 1/2007 | Hinkle et al. | |
| 2012/0228696 A1 | 9/2012 | Carpenter et al. | |
| 2012/0326287 A1 | 12/2012 | Joshi et al. | |
| 2013/0127029 A1 | 5/2013 | Lee et al. | |
| 2014/0063744 A1 | 3/2014 | Lopez et al. | |
| 2017/0178787 A1 * | 6/2017 | Massolini | H01F 41/0206 |
| 2019/0115289 A1 * | 4/2019 | Shibuya | H01L 23/49551 |
| 2019/0206812 A1 * | 7/2019 | Bonifield | H04B 5/0012 |
| 2020/0194357 A1 * | 6/2020 | Shibuya | H01L 23/49562 |
| 2020/0211934 A1 * | 7/2020 | Ko | H01L 23/49575 |
| 2020/0211939 A1 * | 7/2020 | Khanolkar | H01L 23/3107 |

* cited by examiner

PACKAGE WITH DIES MOUNTED ON OPPOSING SURFACES OF A LEADFRAME

TECHNICAL FIELD

This disclosure relates to semiconductor packages.

BACKGROUND

Packaged power supply circuit assemblies can include power switching devices for converting direct current (DC) voltage to another DC voltage. Some power converters include two power metal-oxide-semiconductor field effect transistors (MOSFETs) connected in series and coupled together by a common switch node; such an assembly is also called a half bridge. When a regulating driver and controller is added, the assembly is referred to as a synchronous buck converter. In a synchronous buck converter, the control field-effect transistor (FET) die, also called the high-side switch, is connected between the supply voltage VIN and the LC output filter. The synchronous (sync) FET die, also called the low side switch, is connected between the LC output filter and ground potential. The gates of the control FET die and the sync FET die are connected to a semiconductor die including the circuitry for the driver of the converter and the controller; this driver integrated circuit (IC) is also connected to ground potential.

In some power switching devices, the dies of the power MOSFETs and the driver IC are assembled horizontally side-by-side as individual components. Each die is typically attached to a rectangular or square-shaped pad of a metallic leadframe; the pad is surrounded by leads as input/output terminals. In other power switching devices, the power MOSFET dies and the driver IC are assembled horizontally side-by-side on a single leadframe pad, which in turn is surrounded on all four sides by leads serving as device input/output terminals. The leads are commonly shaped without cantilever extensions and arranged in the manner of Quad Flat No-Lead (QFN) or Small Outline No-Lead (SON) devices.

The electrical connections from the dies to the leads may be provided by wires with wire bonds, which introduce, due to their lengths and resistances, significant parasitic inductance into the power circuit. In some assemblies, clips substitute for many connecting wires. These clips are wide and introduce reduced parasitic inductance. Each assembly is typically covered with mold compound, and the packaged components are employed as discrete building blocks for board assembly of power supply systems.

In some synchronous buck converters, the control FET die and the sync FET die are assembled vertically on top of each other as a stack, and with clips providing the connections to the switch node and the stack top. Such an example synchronous buck converter package is depicted as package 100 in FIG. 1.

In package 100, control MOSFET 120 is stacked on sync MOSFET 130. QFN metal leadframe 110 has a rectangular flat pad 111, which serves as the output terminal and as a heat spreader for package 100. Leads 114, 116 are positioned in lines along two opposite sides of pad 111. FET dies 120, 130 are each stacked in a source-down configuration: the source of sync FET 130 is soldered to leadframe pad 111 by solder layer 131, and the source of control FET 120 is soldered to low side clip 150 by solder layer 121. Driver IC 140 is attached by solder layer 142 to pad 111 horizontally side-by-side with sync FET 130.

Low side clip 150 and high side clip 160 are gang placed. Low side clip 150 is soldered by solder layer 132 onto the drain of sync FET 130, and, as previously mentioned, is attached to source of control FET 120 by solder layer 121. Consequently, low side clip 150 serves as the switch node terminal of the synchronous buck converter. High side clip 160 is connected by solder layer 122 to the drain of control FET 120. High side clip 160 is also connected to the input supply VIN via a lead 116. Wire bonds 143 provide the connections to the die terminals and FET gate terminals 126, 134, 136. Mold compound 102 covers these electronics of package 100, leaving contact areas of leads 114, 116 exposed to facilitate electrical connections thereto and leaving rectangular flat pad 111 exposed to support heat spreading.

BRIEF SUMMARY

Packages disclosed herein include a first die on first surface of a leadframe in a flipchip arrangement and a second die on the opposing second surface of the leadframe, the second die utilizing wire bonds to connect to the leadframe. Also disclosed are techniques for manufacturing such packages. In particular examples, the techniques disclosed herein are applied to synchronous buck converters with both the control FET die and the sync FET die being on a first surface of the leadframe in flipchip arrangements and the driver IC being mounted to the opposing second surface of the leadframe utilizing wire bonds to connect to the leadframe. Such a configuration provides a stacked arrangement on opposing sides of a leadframe without the need for clips, which may both reduce the overall size of a package and reduce manufacturing costs as compared to other stacked arrangements, such as those described with respect to FIG. 1.

In one example, a package includes a leadframe having first surface and a second surface opposing the first surface, the leadframe forming a plurality of leads, a first semiconductor die mounted on the first surface of the leadframe and electrically connected to at least one of the plurality of leads, a second semiconductor die mounted on the second surface of the leadframe, wire bonds electrically connecting the second semiconductor die to the leadframe, and mold compound at least partially covering the first semiconductor die, the second semiconductor die and the wire bonds.

In another example, a method of forming a package includes arranging a first semiconductor die on a first surface of a leadframe in a flipchip arrangement, reflow processing the flipchip arrangement so that solder bumps form electrical connections between the first semiconductor die and leads of the leadframe, mounting a second semiconductor die on a second surface of the leadframe using die attach between the second semiconductor die and the second surface of the leadframe, the second surface opposing the first surface, forming electrical connections between the second semiconductor die and the leads of the leadframe to form wire bonds that electrically connect the first semiconductor die and the second semiconductor die, and molding to at least partially cover the first semiconductor die, the second semiconductor die, and the wire bonds using mold compound.

In another example, a package includes a leadframe having first surface and a second surface opposing the first surface, the leadframe forming a plurality of leads, a synchronous (sync) field effect transistor (FET) comprising sync FET contacts, and a control FET comprising control FET contacts. The sync FET and control FET are arranged on the first surface of the leadframe such that the sync FET contacts and the control FET contacts are each electrically coupled to at least one of the plurality of leads. The package further includes a driver integrated circuit (IC) mounted on the second surface of the leadframe, wire bonds electrically connecting the driver IC to the leadframe to form a synchronous buck converter including the driver IC, the control FET, and the sync FET, and mold compound at least partially covering the sync FET, the control FET, the driver IC and the wire bonds.

DETAILED DESCRIPTION

Figure 1:
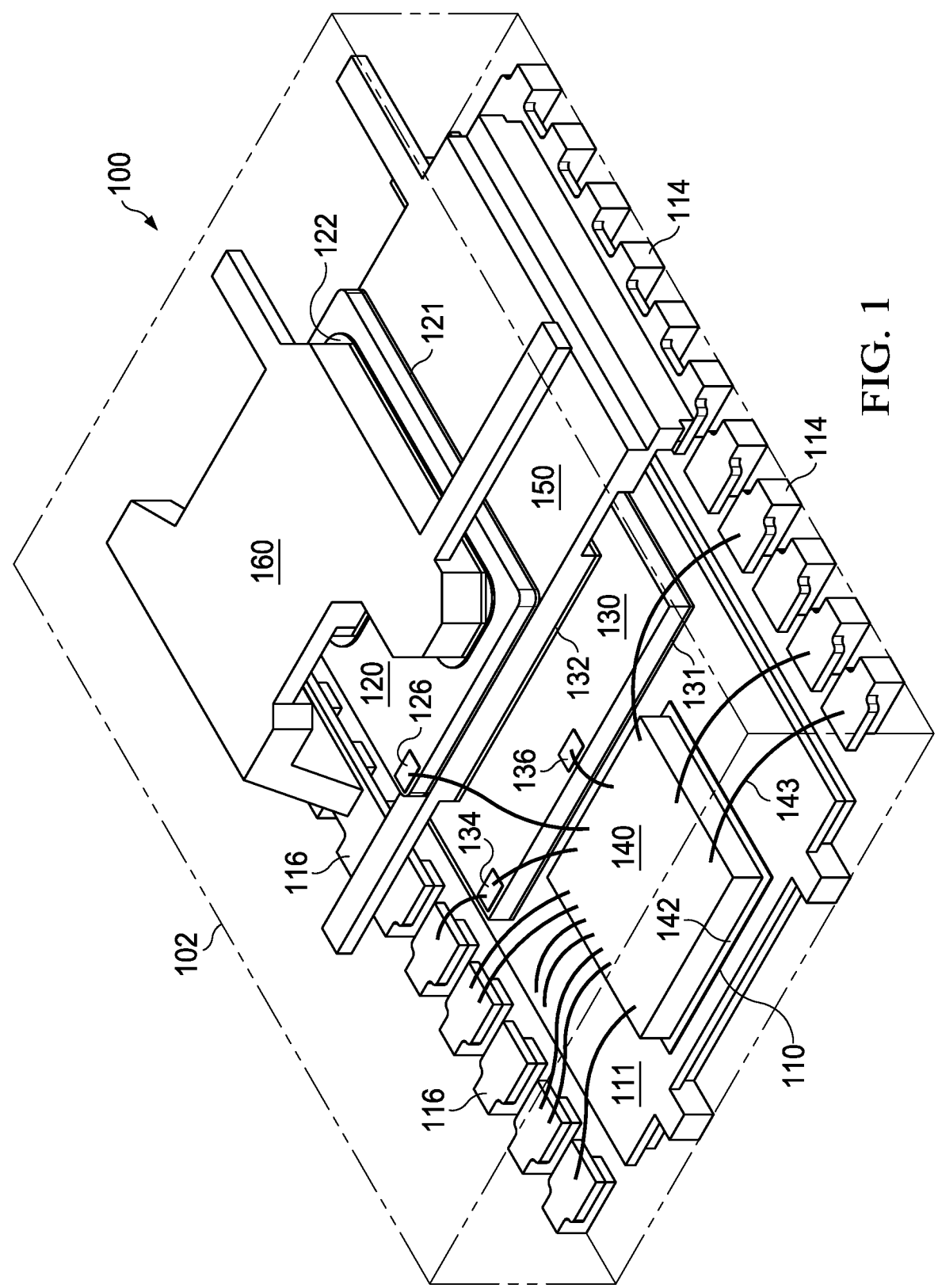
FIG. 1 shows a perspective view of a synchronous buck converter with a driver IC assembled adjacent to vertically stacked FET dies and two clips on a leadframe pad according to prior art.

Packages disclosed herein include a first die on first surface of a leadframe in a flipchip arrangement and a second die on the opposing second surface of the leadframe, the second die utilizing wire bonds. Such techniques provide packages in a stacked arrangement without the need for a clip layer, thereby facilitating smaller packages and reduced manufacturing costs as compared to some other stacked arrangements, such as those described with respect to FIG. 1. In addition, the compact designs disclosed herein provide for short electrical connections between dies of a package, facilitating low impedance connections between the dies, which supports power efficiency and mitigates heat generation.

Figure 2A:
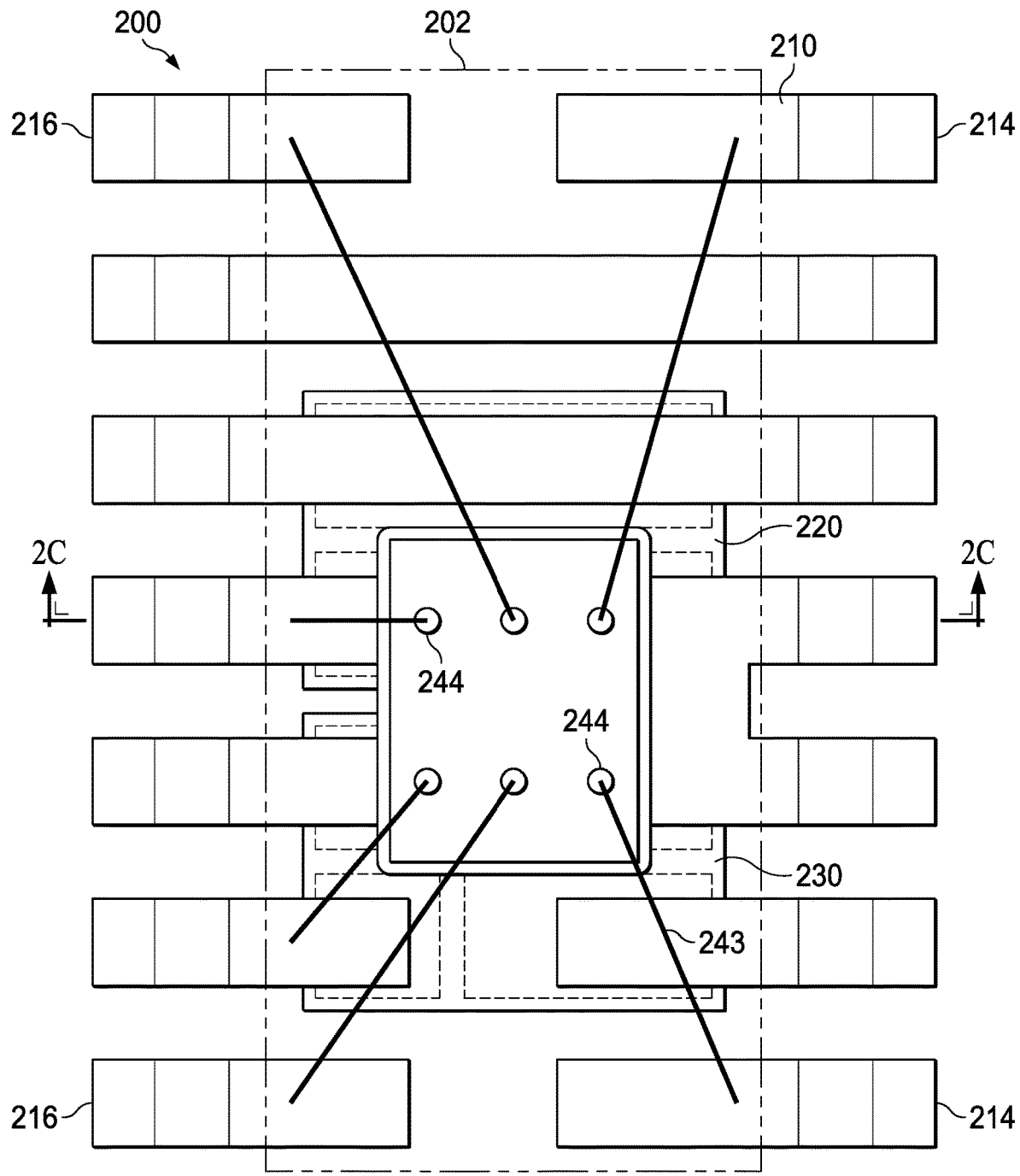
FIG. 2A shows a top view of a conceptual synchronous buck converter with adjacent FET dies vertically stacked relative to the driver IC on a single leadframe.

FIG. 2A shows a top view of a semiconductor package, synchronous buck converter 200. Synchronous buck converter 200 includes the converter electronics and mold compound 202 covering the converter electronics. The electronics of converter 200 include control FET die 220 and sync FET die 230 on a first surface of leadframe 210 in flipchip arrangements. In addition, driver IC 240 is vertically stacked relative to dies 220, 230 on the opposing second surface of leadframe 210. Driver IC 240 utilizes wires 243 with wire bonds to connect to leadframe 210.

Figure 2B:
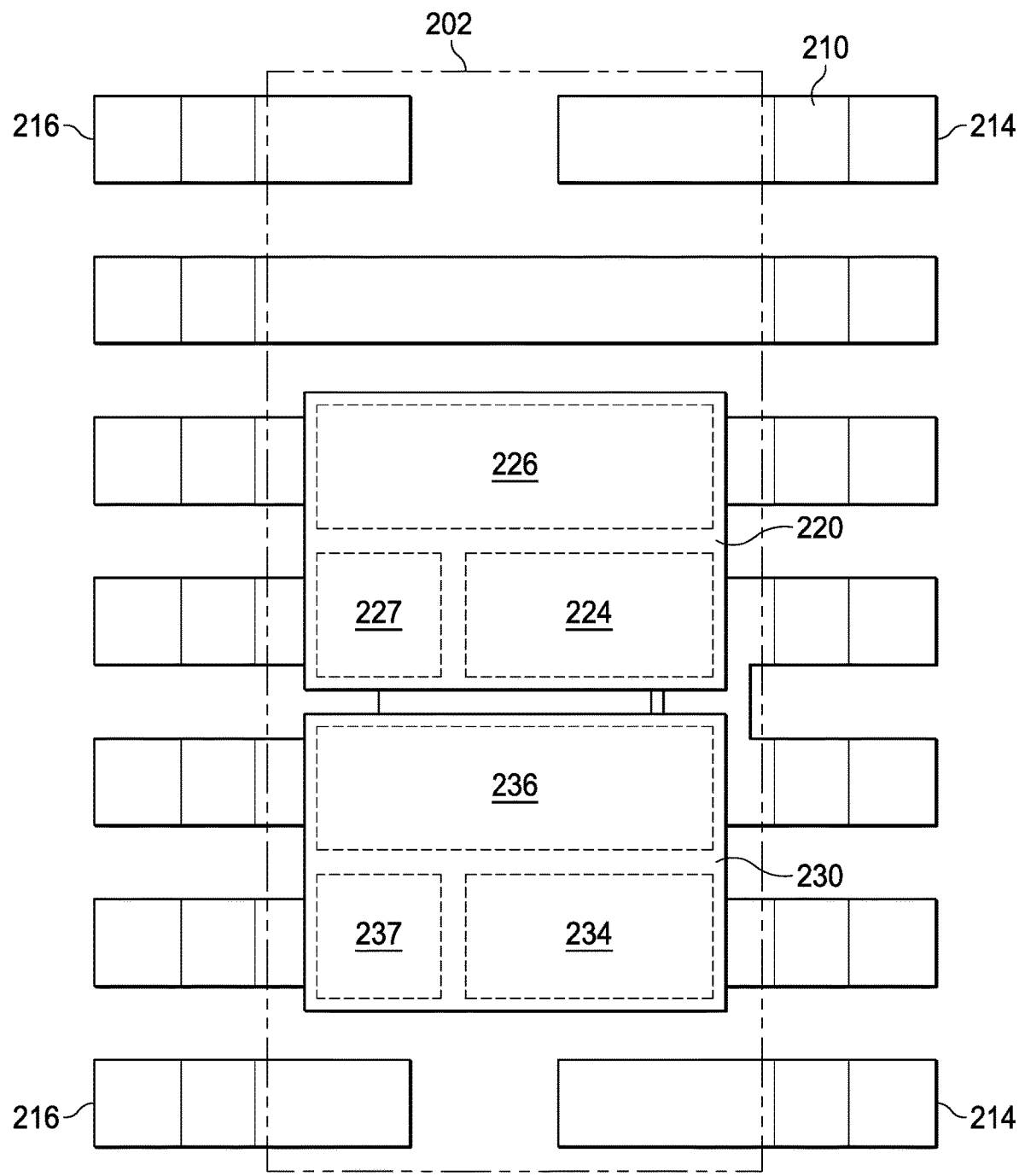
FIG. 2B shows a top view of the FET dies of the converter of FIG. 2A relative to the leadframe.
Figure 2C:
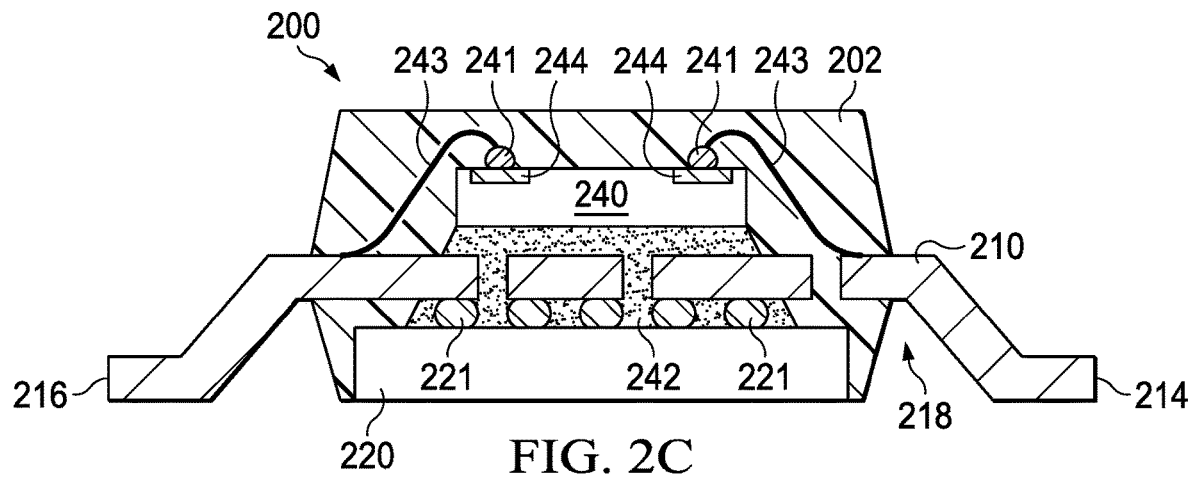
FIG. 2C shows a cutaway side view of the converter of FIG. 2A including flipchip arrangements between the FET dies and the leadframe and wire bonds between the driver IC and the leadframe.

FIG. 2B shows a top view of dies 220, 230 in converter 200 relative to leadframe 210. FIG. 2C shows a cutaway side view of converter 200 including a flipchip arrangement between dies 220, 230 and leadframe 210 and wire bonds between driver IC 240 and leadframe 210.

Leadframe 210 forms leads 214, 216 positioned in lines along two opposite sides of leadframe 210 and extend outward from mold compound 202. In the configuration shown, leads 214, 216 form die attach sites with electrical contact points corresponding to dies 220, 230. A die attach site as referenced herein represents the contact areas for physical and electrical connections to dies, such as dies 220, 230. In contrast to leadframe 110, leadframe 210 does not include a rectangular pad surrounded by leads as input/output terminals. Due to position of leadframe 210 within the stacked arrangement of converter 200, heat dissipation from such a central pad would be limited. In some examples, a such a rectangular pad could be added to leadframe 210, for example, to provide a larger mounting surface for attachment of dies 220, 230 to leadframe 210.

Leadframes, such as leadframes 110, 210, are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment, such as wire bonding, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and siderails may be removed during singulation of the packages. The term leadframe of represents the portions of the leadframe strip remaining within a package after singulation. With respect to converter 200, leadframe 210 includes leads 214, 216 although those elements are not interconnected following singulation of converter 200.

Figure 5A:
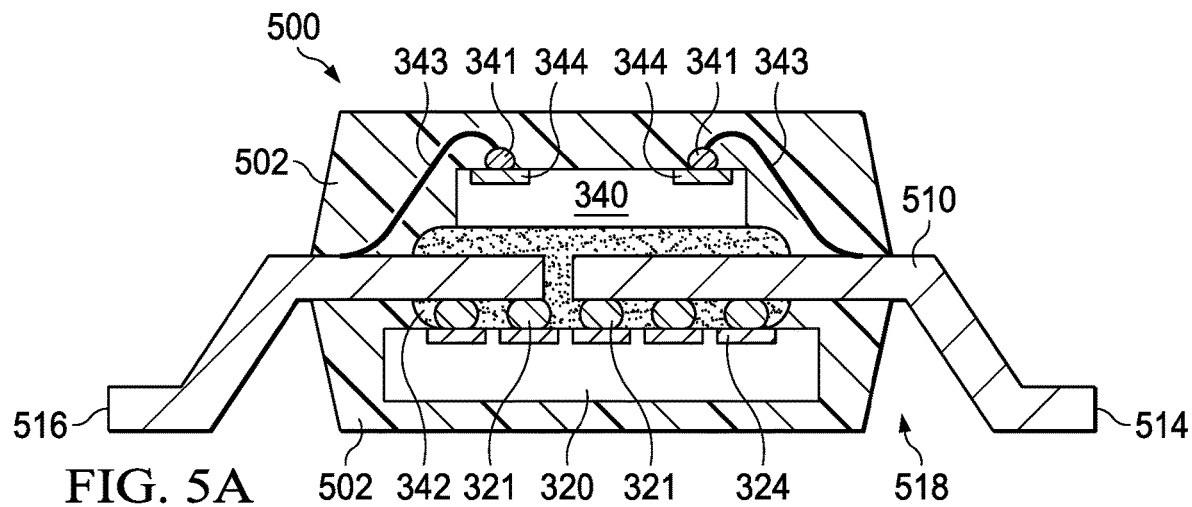
FIG. 5A shows a cutaway side view of a semiconductor package including a first die in a flipchip arrangement on first surface of a leadframe and a second die with wire bonds on the opposing second surface of the leadframe, the package including an outer mold layer covering the first and second dies.

Leads 214, 216 form a recess 218. Recess 218 is of a depth such that dies 220, 230 are coplanar relative to distal portions of leads 214, 216 surrounding recess 218. The configuration of leadframe 210 and leads 214, 216 may vary in other examples. For example, leads 214, 216 may form a deeper recess such that dies 220, 230 are recessed relative to distal portions of leads 214, 216 surrounding the recess, as described with respect to package 500 (FIG. 5A). In other examples, leadframe 210, including leads 214, 216 may instead be substantially planar such that dies 220, 230 extend beyond leads 214, 216 on one side of leadframe 210 and driver IC 240 extend beyond leads 214, 216 on the opposing side. In other examples, leads 214, 216 may instead form a recess containing all or a portion of driver IC 240.

Control FET die 220 includes source contact 224, drain contact 226, and gate contact 227. Similarly, sync FET includes source contact 234, drain contact 236, and gate contact 237. In various examples, dies 220, 230 can be combined into a single monolithic die or two separate dies. Each contact of dies 220, 230 is electrically connected to the corresponding leads of leadframe 210. Specifically, the die attach site of leadframe 210 for control FET die 220 includes a source contact, a drain contact, and a gate contact corresponding to source contact 224, drain contact 226, and gate contact 227 of control FET die 220. Likewise, the adjacent die attach site of leadframe 210 for sync FET die 230 includes a source contact, a drain contact, and a gate contact corresponding to source contact 234, drain contact 236, and gate contact 237 of sync FET die 230.

Control FET die 220 is secured to the surface of leadframe 210 with solder bumps 221 in a flipchip arrangement to form electrical connections between source contact 224, drain contact 226, and gate contact 227, and the corresponding leads at the die attach site for control FET die 220. Likewise, sync FET die 230 is secured to the same surface of leadframe 210 with solder bumps (not shown) in the flipchip arrangement to form electrical connections between source contact 234, drain contact 236, and gate contact 237, and the corresponding leads at the die attach site for sync FET die 230. If control FET die 220 and sync FET die 230 are implemented as a monolithic die, the monolithic die is secured the surface of leadframe 210 in a single flipchip arrangement, or if dies 220, 230 are implemented on separate dies, each would be secured the surface of leadframe 210 in separate flipchip arrangements.

Die attach 242 secures driver IC 240 to the opposite surface of leadframe 210 relative to dies 220, 230. Die attach 242 is a nonconductive die attach material, such as a nonconductive die attach paste. Die attach 242 also serves as underfill for dies 220, 230. Die attach 242 applied opposite dies 220, 230 flows around leads 214, 216 to fill the space between leadframe 210 and dies 220, 230. Leads 214, 216 are configured to cover a majority of the area beneath dies 220, 230 to provide sufficient adhesion strength for dies 220, 230 on leadframe 210 through both the solder joints in the flipchip arrangement and underfill.

Driver IC 240 includes a number of bond pads 244 attached to wires 243 with wire bonds 241 electrically connecting driver IC 240 to the die terminals and to dies 220, 230. Specifically, wires 243 with wire bonds connect driver IC 240 to leads 214, 216 for both gate contact 227 of control FET die 220 and gate contact 237 of sync FET die 230 in order to control switching of dies 220, 230 within converter 200. In some examples, wire bonds 241 of wires 243 may represent a ball bond with a stitch bond at leads 214, 216, or vice versa. Additional wires 243 with wire bonds connect driver IC 240 to additional leads 214, 216 for power and communication connections with external components.

To facilitate the operation of synchronous buck converter 200, drain contact 226 of control FET die 220 connects to VIN via leads 214, 216 of leadframe 210, and source contact 234 of sync FET die 230 connects to ground via a leads 214 of leadframe 210. In turn, source contact 224 of control FET die 220 is connected to drain contact 236 of sync FET die 230 via two coupled leads 214, which serve as the switch node terminal of converter 200. However, with a monolithic die, source contact 224 of control FET die 220 may be internally connected to drain contact 236 of sync FET die 230, leaving only a single exposed bond pad to serve as the switch node terminal of the converter.

Mold compound 202 provides a protective layer covering electronics of converter 200, including leadframe 210, driver IC 240, wires 243 and connections therebetween. Mold compound 202 may be formed from a nonconductive plastic or resin material. In some examples, mold compound 202 is molded over the electronics of converter 200 in a transfer molding process. Mold compounds suitable for use as mold compound 202 include, for example, thermoset compounds that include an epoxy novolac resin or similar material combined with a filler, such as alumina, and other materials to make the compound suitable for molding, such as accelerators, curing agents, filters, and mold release agents.

Mold compound 202 only partially covers dies 220, 230, leaving exposed surfaces of dies 220, 230 flush with mold compound 202 on the surface of converter 200. While mold compound 202 may be selected to facilitate heat dissipation during the operation of converter 200, the exposed surfaces of dies 220, 230 may further facilitate heat dissipation by allowing direct contact between dies 220, 230 and air or a heat sink. Leads 214, 216 form a recess in which dies 220, 230 are located. In the example shown, the distal ends of leads 214, 216, are approximately coplanar with the exposed outer surface of dies 220, 230. Such a configuration may facilitate supporting leads 214, 216 and dies 220, 230 on a flat surface during the molding process.

FIGS. 3A-3D illustrate conceptual process steps for manufacturing semiconductor package 300. FIG. 4 is flowchart of a method of manufacturing package 300. For clarity, the techniques of FIG. 4 are described with respect to package 300 and FIGS. 3A-3D; however, the described techniques may also be utilized in the manufacture of buck converter 200.

Package 300 includes semiconductor die 320 mounted on a first surface 311 of leadframe 310 in a flipchip arrangement, and semiconductor die 340 mounted to the opposing second surface 312 of leadframe 310. Die 340 utilizes wire bonds with wires 343 to connect to leads 314, 316 of leadframe 310. In some specific examples, die 320 may represent control FET die 220 and/or sync FET die 230 of buck converter 200, and die 340 may represent driver IC 240 of buck converter 200.

Figure 3A:
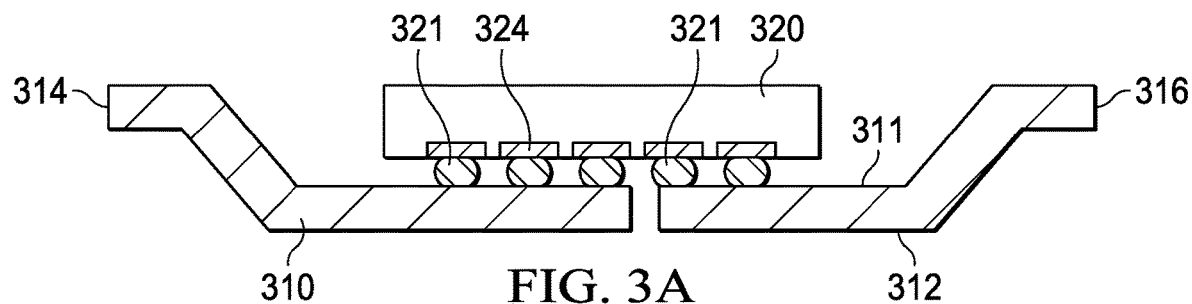
FIGS. 3A-3D illustrate conceptual process steps for manufacturing a semiconductor package including a first die on first surface of a leadframe in a flipchip arrangement and a second die with wire bonds on the opposing second surface of the leadframe.
Figure 4:
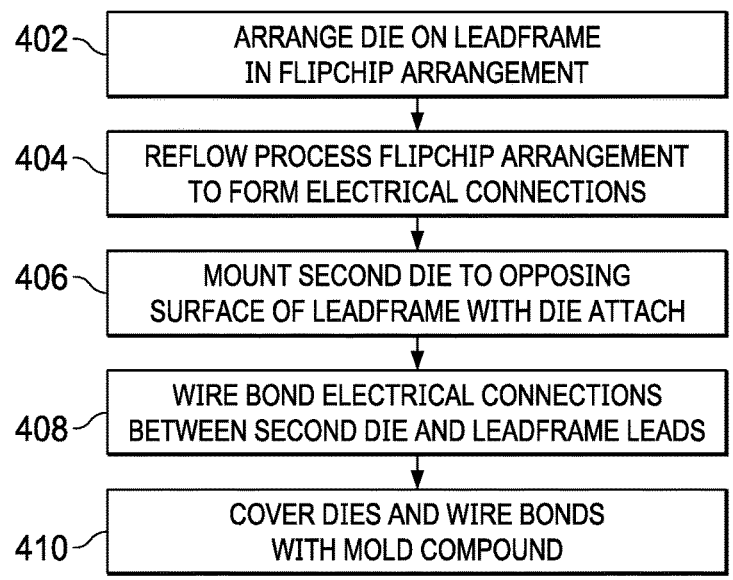
FIG. 4 is flowchart of a method of manufacturing a semiconductor package including a first die on first surface of a leadframe in a flipchip arrangement and a second die with wire bonds on the opposing second surface of the leadframe.

FIG. 3A illustrates die 320 arranged on surface 311 of leadframe 310 in a flipchip arrangement (FIG. 4, step 402). Leadframe 310 forms leads 314, 316 positioned in line along two opposite sides of leadframe 310, as also illustrated with respect to leadframe 210 and leads 214, 216. In the flipchip arrangement, electrical contacts 324 of die 320 are positioned on surface 311 of leadframe 310 to connect to leads 314, 316.

The flipchip arrangement is reflow processed so that solder bumps 321 form electrical connections between die 320 and leads 314, 316 at the die attach site of leadframe 310 (FIG. 4, step 404). Leads 314, 316 form a recess 318 in which die 320 is located such that the distal ends of leads 314, 316, are approximately coplanar with the exposed outer surface of die 320. Such a configuration facilitates supporting leads 314, 316, and die 320 on a flat surface during the attachment of die 340 as described with respect to FIG. 3B.

Figure 3B:
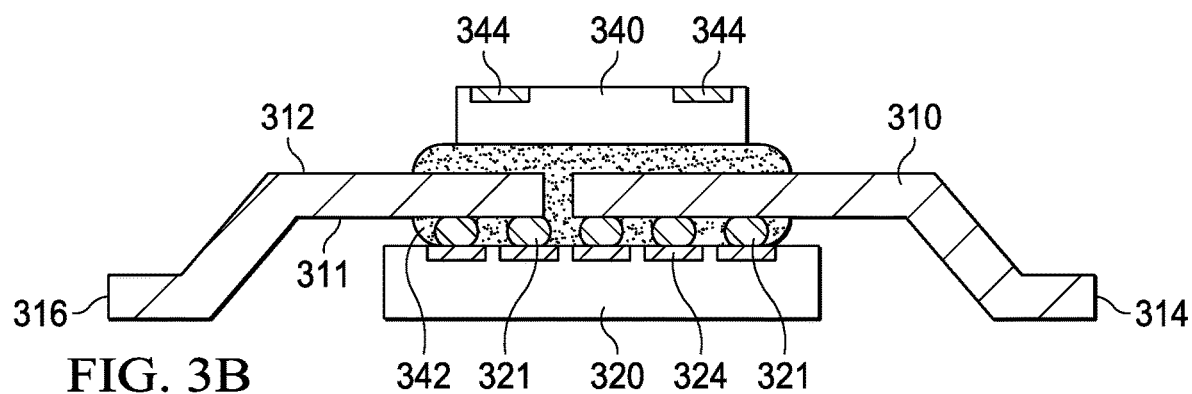

As shown in FIG. 3B, die 340 is mounted on surface 312 of leadframe 310, which opposes surface 311, using nonconductive die attach 342 (FIG. 4, step 406). Die attach 342 also serves as underfill between die 320 and surface 311 of leadframe 310. Die attach 342 will have a maximum thickness equal to the spacing between die 320 and leadframe 310, plus the thickness of leadframe 310, plus the spacing between die 340 and leadframe 210. In an example embodiment, leadframe 310 may have a thickness of about 200 µm, the spacing between die 320 and leadframe 310 may be about 75 micrometers (μall), and the spacing between die 340 and leadframe 210 may be about 75 μm, for a total maximum thickness of about 350 μm. A single application of die attach can support a thickness of at least 500 μm, which is suitable for this example.

Figure 3C:
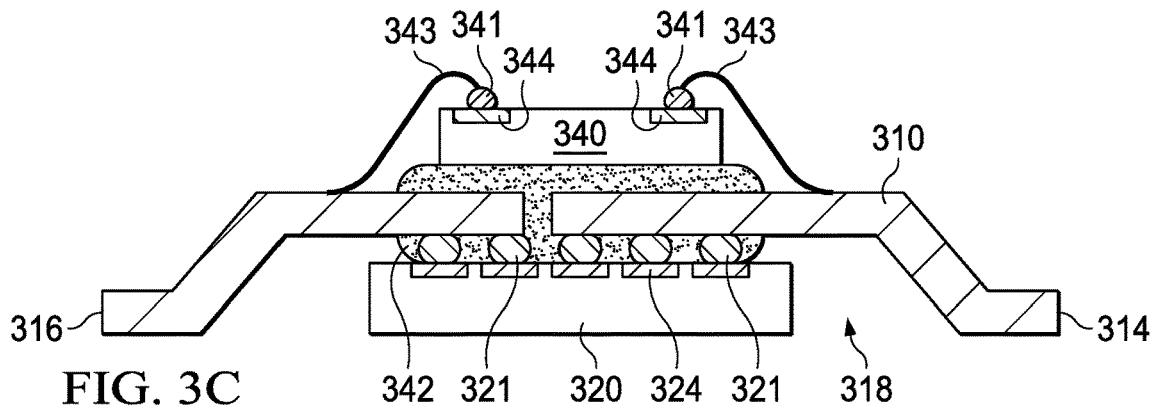

As shown in FIG. 3C, wires 343 form electrical connections between bond pads 344 of die 340 and leads 314, 316 (FIG. 4, step 408) with wire bonds 341. The wire bonding techniques should be selected to avoid adversely affecting electrical connections between die 320 and leads 314, 316. For example, wire bonding should not heat solder bumps 321 to their melting point. In some examples, solder bumps 321 may have a melting point of at least 230 degrees Celsius. Such examples may utilize wire bonding techniques at temperatures of about 180 degrees Celsius or less. In some specific examples, connections between bond pads 344 of die 340 and leads 314, 316 may occur with wedge bonds of gold-aluminum, which can bond at room temperature.

Figure 3D:
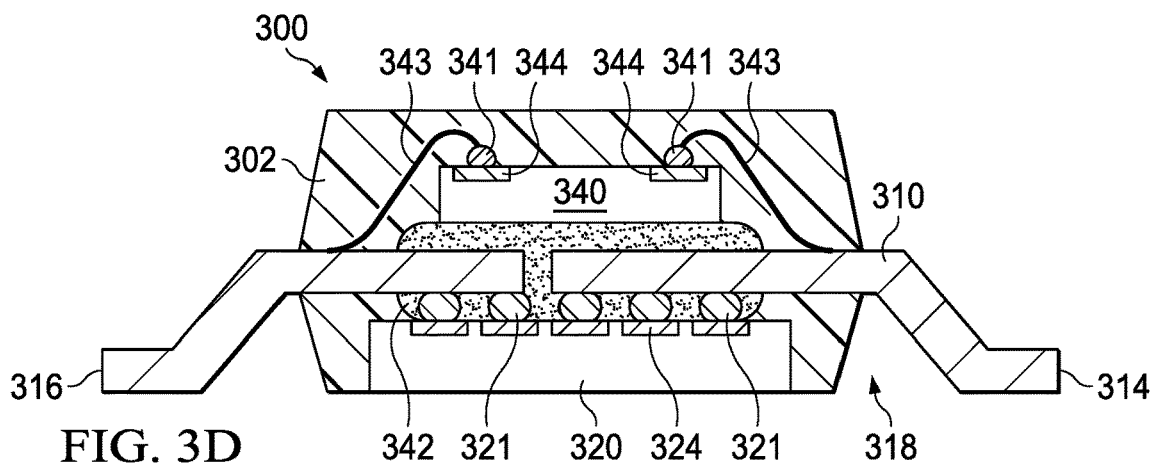

As shown in FIG. 3D, mold compound 302 is applied to cover die 340 and the wire bonds between die 340 and leadframe 310. In addition, mold compound 302 is applied to partially cover die 320, leaving die surfaces opposite leadframe 310 exposed and flush with mold compound 302 on an outer surface of package 300 (FIG. 4, step 410). In some examples, applying mold compound 302 may include transfer molding.

While mold compound 302 may be selected to facilitate heat dissipation during the operation of package 300, the exposed surface of die 320 may further facilitate heat dissipation by allowing direct contact between die 320 and air or a heat sink. In some examples, the molding techniques may include applying tape to shield the exposed surface of die 320 from mold compound 302 prior to molding such that the exposed surface of die 320 is flush with mold compound 302 on an outer surface of package 300.

In other examples, as shown with respect to semiconductor package 500 (FIG. 5B), the mold compound may fully cover dies 320, 340, and the wire bonds formed with wires 343. In such examples, leads 314, 316 may form a deeper recess of sufficient depth such that die 320 is recessed relative to portions of leads 314, 316 surrounding the recess in the flipchip arrangement, as shown in the example of package 500 (FIG. 5A). In other examples, leadframe 310, including leads 314, 316 may instead be substantially planar, or leads 314, 316 may instead form a recess containing all or a portion of die 340.

In some examples, package 300 may be one of an array of packages manufactured on an array of interconnected leadframes 310. In such examples, the method further includes singulating the array of molded packages to form individual packages 300. Singulation may include cutting through mold compound 302 and tie bars linking the interconnected leadframes 310 with a saw or other cutting implement.

Figure 5B:
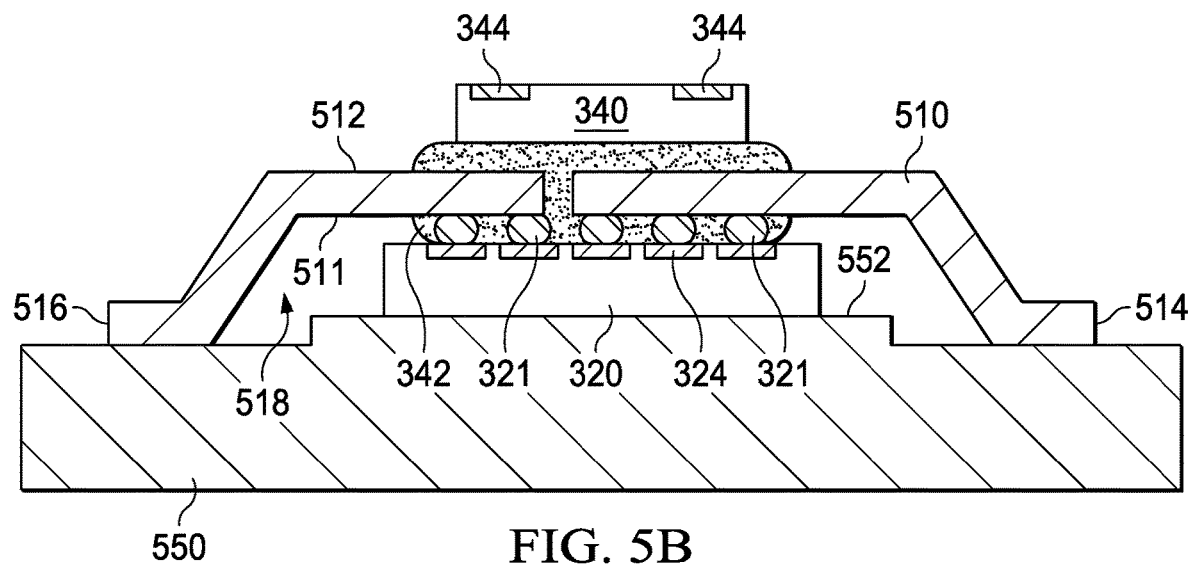
FIG. 5B illustrates a conceptual process step for manufacturing a semiconductor package of FIG. 5A.

FIG. 5A shows a cutaway side view of semiconductor package 500, and FIG. 5B illustrates a conceptual process step for manufacturing package 500. Like package 300, package 500 includes semiconductor die 320 mounted to a first surface of leadframe 510 in a flipchip arrangement, and semiconductor die 340 mounted to the opposing surface of leadframe 510. Die 340 utilizes wire bonds with wires 343.

Package 500 is substantially similar to semiconductor package 300 with the exception of leadframe 510 replacing leadframe 310 and mold compound 502 replacing mold compound 302. Elements of package 500 with the same numbers as package 300 are the same or substantially similar to those elements in package 300. For brevity, such elements are described in limited or no detail with respect to package 500.

Leads 514, 516 form a recess 518 surrounding die 320. Recess 518 is of a sufficient depth such that die 320 is recessed relative to portions of leads 514, 516 in the flipchip arrangement.

Following the attachment of die 320 to leadframe 510 in the flipchip arrangement, the attachment of die 340 to leadframe 510 could cause an undesirable bending force applied to the assembly of leadframe 510 and die 320 during the application of die attach 342 and the placement of die 340. Such bending could break solder connections between leadframe 510 and die 320 or break die 320 itself. For this reason, as shown in FIG. 5B, worksurface 550 is not planar, but includes platform 552 to support die 320 during the attachment of die 340 to leadframe 510 and during wire bonding with wires 343.

Due to the depth of recess 518, mold compound 502 provides an outer mold layer covering both die 320 and die 340 such that it fully covers both die 320 and die 340, rather than leaving an exposed surface of die 320. In this manner, mold compound 502 may provide further protection to die 320 as compared to mold compound 302 of package 300.

The specific techniques for packages with a first die on first surface of a leadframe in a flipchip arrangement and a second die on the opposing second surface of the leadframe, the second die utilizing wire bonds, including techniques described with respect to buck converter 200, semiconductor package 300, and semiconductor package 500, are merely illustrative of the general inventive concepts included in this disclosure as defined by the following claims.

What is claimed is:

1. A package comprising:
   a lead including a first surface and a second surface opposing the first surface;
   a first semiconductor die mounted on a portion of the first surface of the lead and electrically connected to the lead;
   a second semiconductor die mounted on the second surface of the lead;
   wire bonds electrically connecting the second semiconductor die to the lead; and
   mold compound at least partially covering the first semiconductor die, the second semiconductor die and the wire bonds.

2. The package of claim 1, further comprising solder bumps forming the electrical connections between the first semiconductor die and the lead such that the first semiconductor die is in a flipchip arrangement on the first surface of the lead.

3. The package of claim 1, further comprising die attach securing the second semiconductor die to the second surface of the lead.

4. The package of claim 3, wherein the die attach also serves as underfill for the first semiconductor die between the first semiconductor die and the first surface of the lead.

5. The package of claim 1, wherein the mold compound partially covers the first semiconductor die, with an exposed surface of the first semiconductor die opposite the lead.

6. The package of claim 1, wherein the mold compound fully covers both the first semiconductor die and the second semiconductor die.

7. The package of claim 6, wherein the first surface of the lead forms a recess with the first semiconductor die recessed relative to portions of the first surface of the lead.

8. The package of claim 1,
wherein the first semiconductor die includes a field effect transistor (FET), and the second semiconductor die includes a driver integrated circuit (IC),
wherein the package forms a power converter including the FET and the driver IC.

9. The package of claim 8, wherein the FET is a synchronous FET, the power converter further comprising a control FET,
wherein the mold compound also at least partially covers the control FET.

10. The package of claim 9, wherein package comprises a buck converter comprising the synchronous FET, the control FET, and the driver IC.

11. A package comprising:
a lead including a first surface and a second surface opposing the first surface;
a first semiconductor die mounted on a portion of the first surface of the lead and electrically connected to the lead, a side of the first semiconductor die including bond pads facing the first surface;
a second semiconductor die on the second surface of the lead and electrically connected to the lead, a side of the second semiconductor die including bond pads facing away from the second surface; and
mold compound at least partially covering the first semiconductor die, the second semiconductor die and the wire bonds.

12. The package of claim 11, wherein the second semiconductor die is electrically connected to the lead via solder bumps.

13. The package of claim 11, wherein the second semiconductor die is on the second surface via a die attach material.

14. The package of claim 13, wherein the die attach material contacts the first surface of the lead, and the first semiconductor die.

15. The package of claim 11, wherein a side of the first semiconductor die opposite the side with the bond pads is exposed from the package.

16. The package of claim 11, wherein a surface of the side of the first semiconductor die opposite the side with the bond pads, is substantially coplanar with a surface of the mold compound.

* * * * *